United States Patent [19]

Voorman

[11] Patent Number: 5,157,343
[45] Date of Patent: Oct. 20, 1992

[54] ELECTRONIC ARRANGEMENT FOR RECEIVING A MODULATED CARRIER SIGNAL

[75] Inventor: Johannes O. Voorman, Eindhoven, Netherlands

[73] Assignee: U.S. Philips Corporation, New York, N.Y.

[21] Appl. No.: 708,427

[22] Filed: May 31, 1991

[30] Foreign Application Priority Data

Jun. 15, 1990 [NL] Netherlands .......................... 9001359

[51] Int. Cl.$^5$ .......................... H03D 1/00; H03D 3/00
[52] U.S. Cl. .................................... 329/319; 329/306; 329/323; 329/327; 329/353; 329/360
[58] Field of Search ............... 329/304, 306, 318, 319, 329/323, 327, 349, 351, 353, 360; 375/28–32, 77

[56] References Cited

U.S. PATENT DOCUMENTS 4,233,684 11/1980 Eggermont ........................ 375/30
5,003,621 3/1991 Gailus ................................ 375/77 X

FOREIGN PATENT DOCUMENTS 8801412 1/1990 Netherlands .

OTHER PUBLICATIONS

M. J. Gingell, "Single Sideband Modulation Using Sequence Asymmetric Polyphase Network", Electrical Communication, vol. 48, Nos. 1 and 2, 1973, pp. 21–25.
Van Ginderdeuren et al., "Cordic-Based HiFi Digital FM Demodulator Algorithm for Compact VLSI Implementation", Electronics Letters, vol. 21, Dec. 5, 1985, pp. 1227–1229.
D. K. Weaver, Jr., "A Third Method of Generation & Detection of Signal-Sideband Signals", Proceedings of the IRE, vol. 44, pp. 1703–1705, (1956).

Primary Examiner—Robert J. Pascal
Attorney, Agent, or Firm—Anne F. Barschall

[57] ABSTRACT

Electronic receive arrangement for receiving a modulated carrier signal, which arrangement comprises a mixer/demodulator driven with the carrier frequency fc, at least one adder included in a closed signal loop, a low-pass filter, and a pulse shaper constituted by a sigma-delta (one-bit) signal converter and driven with the sampling frequency fs and also comprises a digital decimation filter. The signal loop includes the mixer/demodulator so that the modulated carrier signal is applied to the adder and the output signal of the adder is applied to the mixer/demodulator. The signal loop also comprises a second mixer driven with frequency fc, and the frequencies fs and fc present a common multiple.

16 Claims, 2 Drawing Sheets

ELECTRONIC ARRANGEMENT FOR RECEIVING A MODULATED CARRIER SIGNAL

BACKGROUND OF THE INVENTION

1. Field of the Invention

The invention relates to an electronic receive arrangement for receiving a modulated carrier signal. The receive arrangement includes a mixer/demodulator driven with the carrier frequency fc, at least one adder included in a closed signal loop, a low-pass filter, and a pulse shaper driven with the sampling frequency fs and constituted by a sigma-delta (one-bit) signal converter, as well as a digital decimation filter.

2. Related Art

A receive arrangement of this type is known in a configuration in which a modulated carrier signal is demodulated in a mixer/demodulator whose output signal after passing through a low-pass filter is converted into a digital signal in a sigma-delta modulator.

The selectivity of the customary receive arrangements is usually important to three areas, that is to say, band selectivity for radio frequencies, additional channel selectivity for baseband frequencies and channel selectivity for intermediate frequencies. In order for the receivers to be suitable for signals of widely varying levels, the ratio between the maximum undistorted signal and the noise in the filters of the receive arrangement should be extremely large. Passive filters are in principle suitable for signals of these levels, but can never be integrated on silicon. Active filters, more specifically, narrow-band active filters, introduce much more noise and are less linear than passive filters, and they require much power when producing large signals. The most important problem concerning the integration of the amplifier input stages on silicon is thus the integration of selective components.

Two methods are habitually used to simplify the problems encountered with filters in receivers. Direct signal conversion can be used to avoid the use of bandpass filters for intermediate frequencies. The signal can also be converted to a higher frequency signal, thus facilitating the filtering of radio frequencies. In either case the last conversion step is a reshaping of the signal to baseband frequencies, for example, by means of above described prior art arrangement in which the resultant converted baseband analog signal is converted into a digital signal.

The disadvantage linked with the prior art receive arrangements is that a mixer/demodulator that meets the specifications as regards linearity and noise, more specifically signal leakage, is extremely hard to realise in practice for reasons of design technology.

SUMMARY OF THE INVENTION

It is an object of the invention to provide a receive arrangement that does not have this drawback.

According to the invention this object is achieved with the use of a receive arrangement in which the signal loop also comprises the mixer/demodulator, so that the modulated carrier signal is applied to the adder and the output signal of the adder is applied to the mixer/demodulator and in that the signal loop comprises a second mixer driven with frequency fc, and in that the frequencies fs and fc have a common multiple.

In a receive arrangement according to the invention much lower specifications may be valid for the mixer/demodulator than is the case in prior art receivers, because the mixer/demodulator is now included in the forward-directing part of the closed signal loop, so that distortion and noise in the baseband due to the high gain in that part of the loop are strongly suppressed in the mixer/demodulator and in the low-pass filter. Distortion and noise outside the baseband are obstructed by the digital decimation filter, whereas 1/f noise does not play any role in a (one-bit) digital receiver.

Critical design parameters in a receive arrangement according to the invention are linearity and noise in the feedback part of the signal loop.

The use of a one-bit analog-to-digital (A/D) signal converter is compatible with the strict requirement made on the linearity of the signal in the feedback part of the closed loop, as can be seen when a one-bit signal is considered which is constituted by (mutually equal) positive and (mutually equal) negative pulses $1/(2 \cdot fs)$ in width, separated by blanks (that is to say, intervals in which the signal is absent) of the same width in order for avoiding signal leakage. A signal of this structure can simply be decomposed into a signal consisting of equal positive and negative pulses, differing only in their signs, and a DC voltage component and frequency components with integer of multiples of fs, the latter components being substantially totally obstructed by the filter in the signal loop, with non-linear components of the signal not being introduced.

The noise generated in the feedback loop in a receive arrangement according to the invention can be maintained at a low level because the larger part of the noise originates from the transitions between a "0" and a "1" in the one-bit signal, and is determined by the noise bandwidth of an oscillator of necessity included in the receiver. The quantization noise developed during the analog-to-digital conversion may be reduced in the filter in the signal loop (whose optimum design is a compromise between selectivity and stability requirements) and by an increase of the so-called oversampling factor (the ratio between the signal frequency at the input of the pulse shaper and the sampling frequency fs).

The value of the sampling frequency fs is selected so that it has a common multiple with the carrier frequency fs (in a formula: $m \cdot fs = n \cdot fc$, where m and n are integers). With a free choice of fs, infinitely narrow pulses could occur in the output signal of the second mixer, which pulses would lead to distortions in the forward-directing part of the signal loop.

The favorable properties of a receive arrangement according to the invention are specifically manifested if the signal loop also comprises a circuit for automatic gain control (AGC), which circuit generates a one-bit signal with a carrier frequency fc and a variable pulse height and/or pulse width.

By varying the pulse height and/or pulse width, corrections can be made for variations in the input signal (demodulated carrier signal) of the arrangement. The AGC circuit is driven by means of a correction signal generated in a manner known per se.

Different from prior art receivers in which the AGC circuit controls the value of a variable resistance in the input signal and the linearity of the gain control is not high, in a receive arrangement comprising an AGC circuit according to the invention a linear automatic gain control can be provided in a relatively simple manner.

In an exemplary embodiment of a receive arrangement according to the invention the second mixer is included in the feedback part of the closed signal loop and combined with the pulse shaper to a single circuit.

The advantage of a combined pulse shaper/mixer circuit in a receiver of this type is that it can be constructed relatively simply: it is a matter of a digital circuit to which a multiplication operation is added (with plus or minus one, in the rhythm of the carrier).

In a further exemplary embodiment the second mixer is included in the forward-directing part of the closed loop and in that the arrangement comprises a third mixer driven with a frequency fc, so that the input of the third mixer is connected to the output of the second mixer and in that the output of the third mixer is connected to the digital decimation filter.

In this exemplary embodiment the specifications as regards distortion and noise for the second mixer may be less critical just because this mixer now again forms part of the forward-directing part of the closed loop. The third mixer is necessary to ensure that the signal modulated by the second mixer is again demodulated before being applied to the digital decimation filter.

In a preferred embodiment of the receive arrangement according to the latter exemplary embodiment the third mixer and the digital decimation filter are combined in a single circuit. This combination to a single circuit does not cause any problem theoretically and is to be preferred for reasons of design technology when two components for purely digital processes are concerned.

In yet another exemplary embodiment of a receive arrangement according to the invention, this arrangement comprises a second one-bit signal converter whose input is connected to the output of the first one-bit signal converter and whose output is connected to the input of the digital decimation filter. With a receiver of this type it is possible to demodulate modulated carriers having different values of the carrier frequency fc, whereas the bandwidth of the digital (low-pass) decimation filter need not be adapted each time. A second one-bit converter in a receiver usually means only a slight addition compared to the size and the dissipation of the decimation filter, and is to be preferred by far to an alternative embodiment in which the decimation filter is to be rendered programmable.

A receiver according to the invention is pre-eminently suitable as a direct-conversion receiver for AM (amplitude modulated) signals, when it comprises an oscillator whose frequency is linked with the carrier frequency fc by means of a phase-locked loop, which loop comprises a low-pass filter and at least a mixer driven with a carrier frequency fc.

In an exemplary embodiment of a direct-conversion AM receiver according to the invention the sampling frequency fs is an even multiple of the carrier frequency fc and in that the phase-locked loop comprises a frequency divider, which frequency divider has an in-phase output connected to the mixer/demodulator and a quadrature output connected to the mixer in the phase-locked loop.

In still another exemplary embodiment a receive arrangement is provided which is extremely suitable for receiving vestigial sideband AM signals. This exemplary embodiment comprises two parallel signal processing branches each having a receiver according to the invention, in which the low-pass filters in the one-bit signal converters in the two branches are polyphase coupled.

With a receive arrangement according to this exemplary embodiment a remaining sideband AM receiver is obtained in which the two signal processing branches can be made equal within very narrow tolerances by the use of digital components.

In again another exemplary embodiment the digital decimation filters in a receiver according to the latter example are polyphase coupled.

In a preferred embodiment of the latter example, the digital decimation filters are constituted by a series combination of filters having decreasing band-pass and sampling frequencies, while one or more filters for the lowest frequencies from one signal processing branch are polyphase coupled to one or more filters for the corresponding frequencies from the other signal processing branch.

In a receiver according to this preferred embodiment the polyphase couplings provide the required asymmetry of the selectivity of the two signal processing branches. A signal for an automatic frequency control (AFC) known per se can be excluded by a digital decimation filter, just after the last series connected filter which is not polyphase coupled. For an AFC circuit of this type only little additional filtering is necessary. The signal excluded in this manner by an AFC control is advantageous in that it has a symmetrical spectrum that does not lead to amplitude and phase distortions in the AFC circuit which an asymmetric spectrum does.

In again another exemplary embodiment a receive arrangement is obtained which is specifically suitable for receiving frequency modulated (FM) signals. This exemplary embodiment comprises two parallel signal processing branches each having a receiver according to the invention. The branches are coupled by means of signals that have the carrier frequency fc, from which signals one is applied to the mixer/demodulator of one of the two branches and one 90° out of phase signal is applied to the mixer/demodulator of the other branch.

BRIEF DESCRIPTION OF THE DRAWING

The invention will be further explained hereinafter with the aid of the exemplary embodiments with reference to the drawing Figures in which.

DETAILED DESCRIPTION OF THE PREFERRED EMBODIMENTS

Figure 1:
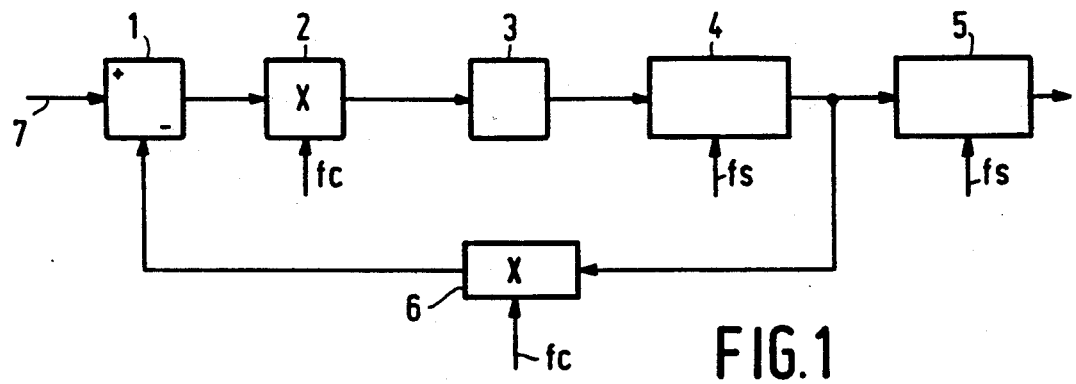
FIG. 1 shows a block diagram of a simple exemplary embodiment of a receive arrangement.

FIG. 1 shows a block diagram of a simple exemplary embodiment of a receiver according to the invention, comprising a sigma-delta (one-bit) signal converter constituted by an adder (1) included in a closed signal loop, a mixer/demodulator (2) driven with the carrier frequency fc, a low-pass filter (3) and a pulse shaper (4) driven with a sampling frequency fs, as well as a digital decimation filter (5) also driven with frequency fc and a second mixer (6) driven with frequency fc and included in the closed loop.

In this receiver the digital decimation filter also provides narrow band channel selectivity, a function performed in prior art receivers by a low-pass filter not included in the feedback loop and inserted after a demodulator. The anti-aliasing function of a filter in prior art receivers is performed in this case by the low-pass filter (3) of the sigma-delta modulator loop, for which purpose this filter consists completely or partly of analog components. The two mixers (2) and (6) are so-called switch modulators in which the modulation of a signal is realized in that this signal is switched on and off in the rhythm of the carrier frequency. In contrast with prior art receivers, the modulated carrier signal (7) is applied to the adder (1) before demodulation takes place. Between fc and fs there is a relationship m·fs=n·fc, where m and n are integers.

Figure 2:
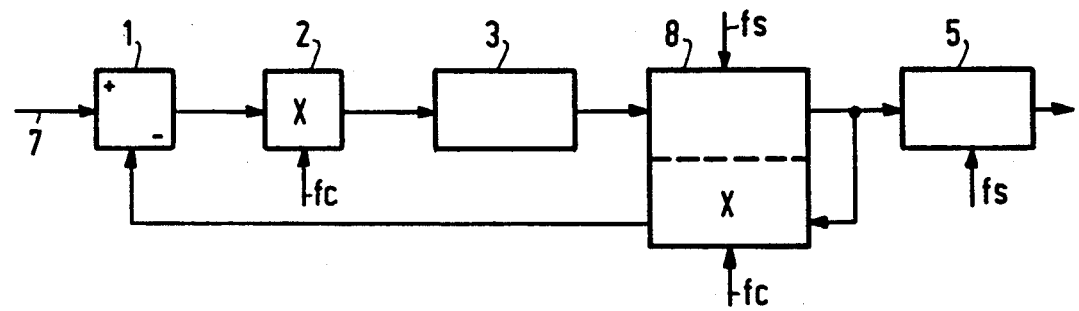
FIG. 2 shows a block diagram of a receive arrangement in which the second mixer is included in the feedback part of the closed signal loop and, with the pulse shaper, is combined to a single circuit.

FIG. 2 shows a block diagram of a receiver again comprising an adder (1) to whose input a modulated carrier signal (7) is applied, a mixer/demodulator (2), a low-pass filter (3) and a decimation filter (5), all as represented in FIG. 1, but, different from that shown in FIG. 1, comprising a second mixer combined with the pulse shaper to a single circuit (8) and included in the feedback part of the closed loop. If the one-bit signal in this receiver is constituted by positive and negative pulses, separated by blanks, the blanks are formed in a circuit (not shown) included in the feedback part of the closed loop, after the circuit (8) comprising the combination of the pulse shaper and the second mixer.

Figure 3:
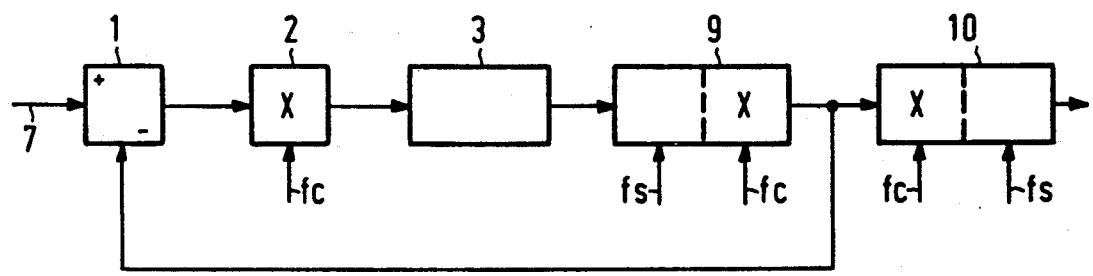
FIG. 3 shows a block diagram of a receive arrangement in which the second mixer, combined with the pulse shaper, is included in the forward-directing part of the closed signal loop and in which the digital decimation filter is combined with a third mixer.

FIG. 3 shows a block diagram of a receiver in which the pulse shaper is combined with a second mixer included in the forward-directing part of the closed loop to a single circuit (9) whose output is connected to a third mixer driven with carrier frequency fc, which mixer is combined with the digital decimation filter to a single circuit (10).

Figure 4:
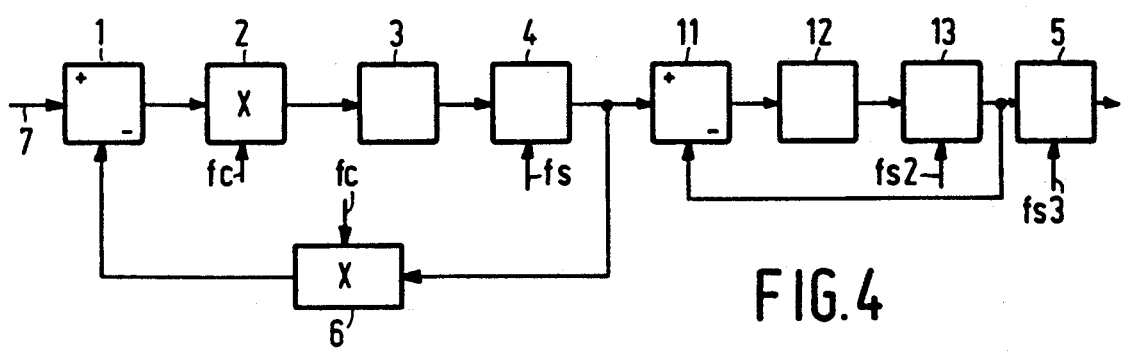
FIG. 4 shows a block diagram of a receive arrangement comprising a second one-bit signal converter.

FIG. 4 shows a block diagram of a receive arrangement comprising a second one-bit signal converter, the arrangement including an adder (1) to which the modulated carrier signal (7) is applied, a mixer/demodulator (2), a low-pass filter (3), a pulse shaper (4), a second mixer (6), and a decimation filter (5) driven with frequency fs3, a second one-bit signal converter constituted by an adder (11), an analog low-pass filter (12) and a pulse shaper (13) driven with a frequency fs2 being inserted between the pulse shaper (4) and the decimation filter (5), while fs2 is related to fs3 and fs3 is no longer related to the carrier frequency fc. In order to smooth the noise spectrum after the first one-bit signal converter, an additional low-pass filter may be inserted between the pulse shaper (4) and adder (11).

Figure 5:
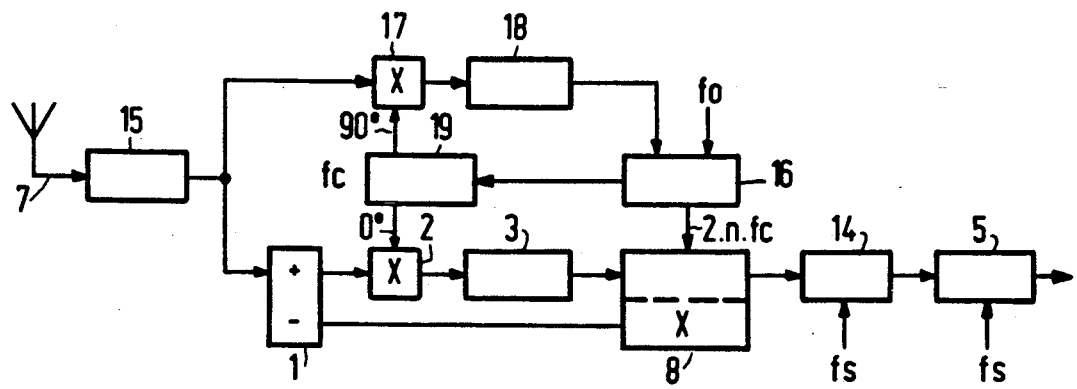
FIG. 5 shows a block diagram of a receive arrangement for AM signals.

FIG. 5 shows a block diagram of a direct conversion receiver for AM signals. An AM signal (7) is applied to a RF input stage (15) comprising an automatic gain control (AGC) circuit, after which the signal is processed in a one-bit receiver comprising an adder (1), a mixer/demodulator (2) (in this example, contrary to the previous examples, not a switch modulator but a sine modulator), a low-pass filter (3) and a combined pulse shaper/mixer (8). The frequency of the oscillator (16) is controlled by means of a phase-locked loop (AFC loop) locked on to the carrier frequency fc. In the diagram the AFC loop is formed by a mixer (17), a low-pass filter (18) and a frequency divider (19). If the oscillator (16) is selected in such a way that it generates an even multiple 2·n·fc (n integer) of carrier frequency fc, an in-phase signal having frequency fc can be applied in a simple manner from frequency divider (19) to the mixer (2), and a quadrature signal to mixer (17). The (low-pass) digital decimation filter (5), preceded by a signal converter (sample rate converter) (14), produces the digital output signal which may be processed further, if necessary. In this example the frequency fs has a fixed value, unequal to the sample rate 2·n·fc because a signal converter (14) is used.

A practical value for the sample rate 2·n·fc for the demodulation of the AM signals in the frequency band from 500 kHz to 1 MHz can be determined in the following manner. With a 3 dB RF bandwidth of 6 kHz (3 kHz for the baseband) and an AGC circuit (15) which can produce a 30 dB gain to an overall dynamic range of 130 dB, it will be sufficient for a one-bit receiver having an optimum loop filter and a 100 dB signal/noise ratio to have a sample rate exceeding 1.4 MHz, corresponding to 2·n·fc=4fc (2 MHz to 4 MHz in the AM band under consideration).

It should be observed that the purpose of this exemplary embodiment is illustrative and by no means restrictive. For example, it is possible without further measures being taken to use a one-bit receiver according to the invention for the AFC loop. Besides, the oscillator could be included in a frequency-generator loop.

Figure 6:
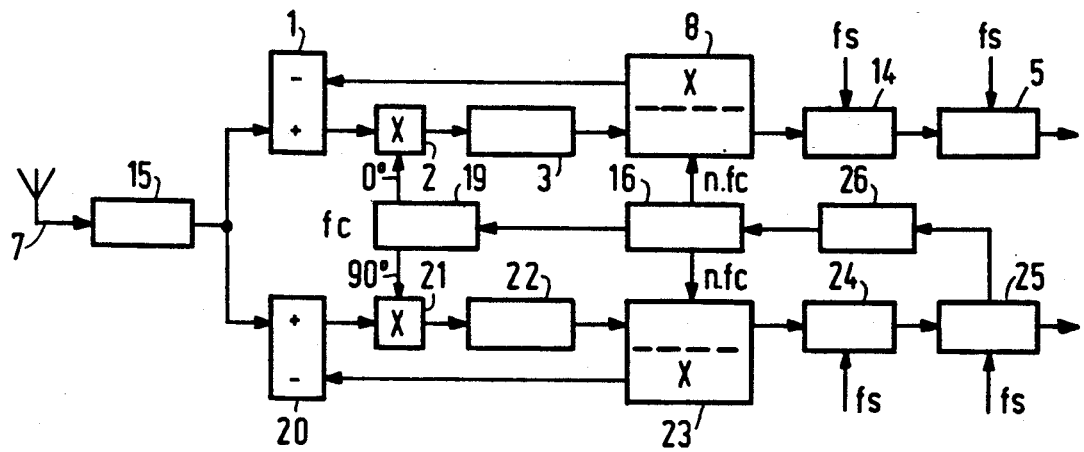
FIG. 6 shows a block diagram of a receive arrangement for vestigial sideband AM signals.

FIG. 6 shows a block diagram of a vestigial sideband receiver for AM signals in three frequency bands between 40 MHz and 1 GHz. Also in this example an AM signal (7) is applied to a RF input stage (15) comprising an automatic gain control circuit (AGC). In the vestigial sideband receiver the in-phase and the quadrature signal are then demodulated in two one-bit receivers according to the invention, comprising each an adder (1, 20 respectively), a mixer/demodulator (2, 21 respectively), a low-pass filter (3, 22 respectively) and a combined pulse shaper/mixer (8, 23 respectively). The low-pass filters (3) and (22) in the one-bit signal converters of the two one-bit receivers are polyphase coupled in a manner known per se (for example, from Dutch Patent Application No. 8801412). The document by Gingell entitled "Single-Sideband Modulation using Sequence Asymmetric Polyphase Networks" in Electrical Communication 48, 21-25 (1973), discloses that polyphase anti-reciprocal couplings between low-pass filters may cause the effective pass-band of the filter to be shifted to positive frequencies. Synchronisation is effected with the aid of a frequency divider (19) from which an in-phase signal having frequency fc is applied to the mixer/demodulator (2) of the in-phase branch and a quadrature signal having frequency fc to the mixer/demodulator (21) of the quadrature branch. The frequency divider (19) divides a signal having frequency n·fc coming from a frequency-stabilised oscillator (16). Of the in-phase and quadrature branches FIG. 6 further shows signal converters (14, 24 respectively) and digital decimation filters (5, 25 respectively) inserted after the combined pulse shaper/mixers (8, 23 respectively) and driven with frequency fs, as well as a low-pass filter (26) included in the frequency stabilisation loop of oscillator (16). In order to give the channel selectivity an asymmetrical response curve relative to 0 Hz, also the digital decimation filters (5 and 25) are polyphase intercoupled (i.e. anti-reciprocally) (not shown).

The signal/noise ratio of the signal converter for a sampling frequency exceeding 825 MHz has a theoretical value of 92 dB. For the highest frequency band fs can be selected to equal 2·fc. With a radio frequency AGC range of 20 dB the dynamic range of this receiver will then be 110 dB.

A problem with prior art vestigial sideband AM receivers is posed by the requirement that the in-phase and quadrature branches be substantially equal. The use of a one-bit receiver according to the invention implies that the unequality is only caused by the unequality of the adders (1, 20 respectively) and the mixers. Unequality in the filters in the two branches, like, for example, in a structure according to Weaver (cf. "A Third Method of Generation and Detection of Single-Sideband Signals", Proc. of the IRE 44, 1703–1705 (1956), does not occur because the selectivity in the two branches is realized digitally (in the decimation filters). For any remaining deviations that do not depend on frequency, corrections can be made in a relatively simple manner.

Figure 7:
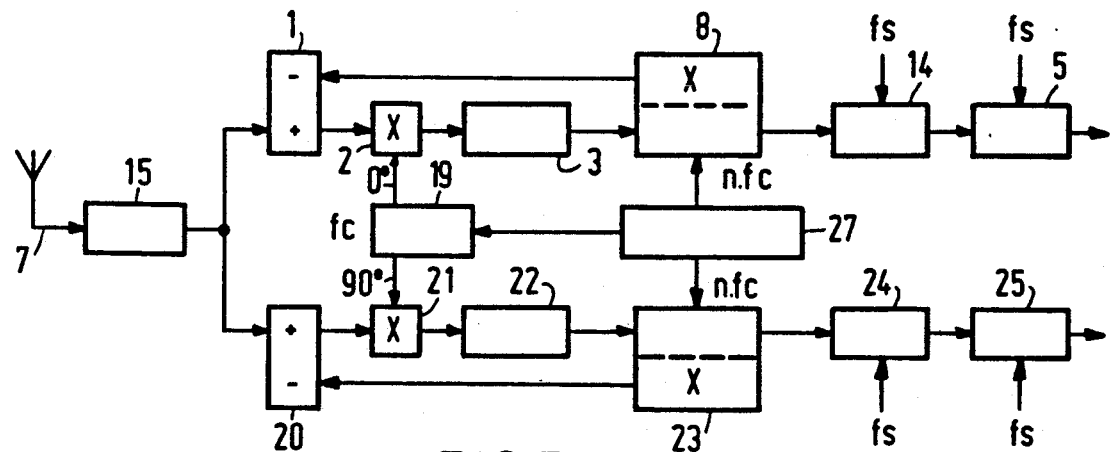
FIG. 7 shows a block diagram of a receive arrangement for FM signals.

FIG. 7 shows a block diagram of a quadrature receiver for FM signals. A FM signal (7) is applied to a RF input stage (15) comprising an automatic gain control circuit (AGC). In the FM receiver the in-phase and the quadrature signal are then demodulated in two one-bit receivers according to the invention, comprising each an adder (1, 20 respectively), a mixer/demodulator (2, 21 respectively), a low-pass filter (3, 22 respectively) and a combined pulse shaper/mixer (8, 23 respectively) driven with sampling frequency n·fc (n integer). The two one-bit receivers form the in-phase and quadrature branches of the FM receiver. The in-phase and quadrature signals may be used not only for frequency-demodulation but also for (automatic) equalisation in order to avoid signal distortion resulting from selective fading. Frequency translation of the FM signals is effected by driving the mixer/demodulator in the in-phase and quadrature branches (2, 21 respectively) by means of an in-phase or quadrature signal respectively, with the frequency fc, which originates from a frequency divider (19) that divides a high-frequency signal coming from an adjustable frequency generator (synthesizer) (27). Digital demodulation may be effected according to an algorithm known per se, for example, the cordic algorithm as described by Van Ginderdeuren et al in "CORDIC-BASED HIFI DIGITAL FM DEMODULATOR, ALGORITHM FOR COMPACT VSLI IMPLEMENTATION" in ELECTRONICS LETTERS 21, 1227–1229 (1985). The Figure further shows from the in-phase and quadrature branches the signal converters (14, 24 respectively) and digital decimation filters (5, 25 respectively) connected after the combined pulse shaper/mixers (8, 23 respectively) and driven with the frequency fs. The output signals of these converters and filters are the aforementioned in-phase and quadrature signals.

With a signal band ranging from −150 kHz to +150 kHz, a 30 dB high-frequency automatic gain control and a 130 dB dynamic range, the sampling frequencies n·fc (n integer) and fs will both be more than 50 MHz.

I claim:

1. An electronic receive arrangement for receiving a modulated carrier signal, comprising a) a closed signal loop acting as a sigma-delta (one-bit) signal converter, the loop including a series arrangement of:
  i) an adder,
  ii) a first mixer/demodulator, coupled to receive a signal from the adder and driven by a carrier frequency fc, and coupled to apply a modulated carrier signal to the adder,
  iii) a low-pass filter,
  iv) a pulse shaper driven with a sampling frequency fs, wherein fc and fs are such that there exist integers m and n for which m·fs = n·fc, and
  v) a second mixer driven with the frequency fc; and
 b) a digital decimation filter.

2. Electronic receive arrangement as claimed in claim 1, characterized in that the signal loop comprises also a circuit for automatic gain control (AGC), which circuit generates the one-bit signal with a carrier frequency fc and a variable pulse height and/or pulse width.

3. Electronic receive arrangement as claimed in claim 1, characterized in that the second mixer is included in the feedback part of the closed signal loop and combined with the pulse shaper as a single circuit.

4. Electronic receive arrangement as claimed in claim 1, characterized in that the second mixer is included in the forward-directing part of the closed loop and in that the arrangement comprises a third mixer driven with the frequency fc, so that the input of the third mixer is connected to the output of the second mixer and in that the output of the third mixer is connected to the digital decimation filter.

5. Electronic receive arrangement as claimed in claim 4, characterized in that the third mixer and the digital decimation filter are combined as a single circuit.

6. Electronic receive arrangement as claimed in one of the preceding claims, characterized in that this arrangement comprises a second one-bit signal converter whose input is connected to the output of the first one-bit signal converter and whose output is connected to the input of the digital decimation filter.

7. Electronic receive arrangement as claimed in claim 1, characterized in that it comprises an oscillator whose frequency is linked with the carrier frequency fc by means of a phase-locked loop, which loop comprises a low-pass filter and at least a mixer driven with a carrier frequency fc.

8. Electronic receive arrangement as claimed in claim 7, characterized in that the sampling frequency fs is an even multiple of the carrier frequency fc and in that the phase-locked loop comprises a frequency divider, which frequency divider has an in-phase output connected to the mixer/demodulator and a quadrature output connected to the mixer in the phase-locked loop.

9. Electronic receive arrangement for receiving a modulated carrier signal, which comprises two parallel signal processing branches constituted each by an arrangement as claimed in claim 6, characterized in that the low-pass filters in the one-bit signal converters in the two branches are polyphase coupled.

10. Electronic receive arrangement as claimed in claim 9, characterized in that the digital decimation filters are polyphase coupled.

11. Electronic receive arrangement as claimed in claim 10, characterized in that the digital decimation filters are constituted by a series combination of filters having decreasing band-pass and sampling frequencies, while one or more filters for the lowest frequencies from one signal processing branch are polyphase coupled to one or more filters for the corresponding frequencies from the other signal processing branch.

12. Electronic receive arrangement for receiving a modulated carrier signal, which arrangement comprises two parallel signal processing branches constituted each by an arrangement as claimed in claim 6, characterized in that the branches are coupled by means of signals that have the carrier frequency fc, from which signals one is applied to the mixer/demodulator of one of the two branches and one 90° out of phase signal is applied to the mixer/demodulator of the other branch.

13. Electronic receive arrangement as claimed in claim 2, characterized in that the second mixer is included in the feedback part of the closed signal loop and combined with the pulse shaper as a single circuit.

14. Electronic receive arrangement as claimed in claim 2, characterized in that the second mixer is included in the forward-directing part of the closed loop and in that the arrangement comprises a third mixer driven with the frequency fc, so that the input of the third mixer is connected to the output of the second mixer and in that the output of the third mixer is connected to the digital decimation filter.

15. An electronic receive arrangement comprising
   a) first and second closed signal loops, each acting as a sigma-delta (one-bit) signal converter and including a series arrangement of:
      i) an adder,
      ii) a first mixer/demodulator, coupled to receive a signal from the adder and driven by a carrier frequency fc, for applying a modulated carrier signal to the adder,
      iii) a second mixer, driven with the frequency fc,
      iv) a low-pass filter, and
      v) a pulse shaper driven with a sampling frequency fs, wherein fc and fs are such that there exist integers m and n for which m·fs = n·fc;
   b) means for polyphase coupling the low-pass filters in the first and loops; and
   c) first and second respective digital decimation filters, each coupled to a respective one of the outputs of the first and second loops.

16. The arrangement of claim 15 wherein the decimation filters are polyphase coupled.

* * * * *